(12) United States Patent
Mouli

(10) Patent No.: US 9,831,287 B2
(45) Date of Patent: Nov. 28, 2017

(54) MEMORY DEVICES AND MEMORY DEVICE FORMING METHODS

(71) Applicant: Micron Technology, Inc., Boise, ID (US)

(72) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/277,551

(22) Filed: Sep. 27, 2016

(65) Prior Publication Data

US 2017/0018598 A1 Jan. 19, 2017

Related U.S. Application Data

(60) Continuation of application No. 14/518,810, filed on Oct. 20, 2014, now Pat. No. 9,466,361, which is a
(Continued)

(51) Int. Cl.
*G11C 5/02* (2006.01)
*H01L 27/24* (2006.01)
(Continued)

(52) U.S. Cl.
CPC ............ *H01L 27/2418* (2013.01); *G11C 5/02* (2013.01); *G11C 11/34* (2013.01); *G11C 11/5664* (2013.01); *G11C 11/5678* (2013.01); *G11C 11/5685* (2013.01); *G11C 13/0002* (2013.01); *G11C 13/003* (2013.01); *G11C 13/0004* (2013.01); *G11C 13/0007* (2013.01); *G11C 13/0014* (2013.01); *G11C 13/0016* (2013.01);
(Continued)

(58) Field of Classification Search
CPC . G11C 11/34; G11C 11/5664; G11C 11/5678; G11C 11/5685; G11C 13/0002; G11C 13/0004; G11C 13/0007; G11C 13/0014; G11C 13/0016; G11C 13/003; G11C 5/02; H01L 27/2418; H01L 45/00; H01L 45/141; H01L 45/145; H01L 45/16
See application file for complete search history.

(56) References Cited

U.S. PATENT DOCUMENTS 7,838,860 B2 * 11/2010 Happ .................... H01L 27/101
257/2
8,120,951 B2 * 2/2012 Mouli ................. G11C 11/5664
257/4
(Continued)

*Primary Examiner* — Toan Le
(74) *Attorney, Agent, or Firm* — Wells St. John P.S.

(57) ABSTRACT

Some embodiments include memory devices having a wordline, a bitline, a memory element selectively configurable in one of three or more different resistive states, and a diode configured to allow a current to flow from the wordline through the memory element to the bitline responsive to a voltage being applied across the wordline and the bitline and to decrease the current if the voltage is increased or decreased. Some embodiments include memory devices having a wordline, a bitline, memory element selectively configurable in one of two or more different resistive states, a first diode configured to inhibit a first current from flowing from the bitline to the wordline responsive to a first voltage, and a second diode comprising a dielectric material and configured to allow a second current to flow from the wordline to the bitline responsive to a second voltage.

20 Claims, 11 Drawing Sheets

Related U.S. Application Data continuation of application No. 13/292,932, filed on Nov. 9, 2011, now Pat. No. 8,867,267, which is a division of application No. 12/125,797, filed on May 22, 2008, now Pat. No. 8,120,951.

(51) Int. Cl.

| | | |
|---|---|---|
| *G11C 11/56* | (2006.01) | |
| *G11C 13/00* | (2006.01) | |
| *H01L 45/00* | (2006.01) | |
| *G11C 11/34* | (2006.01) | |
| *H01L 29/66* | (2006.01) | |

(52) U.S. Cl.
CPC .......... *H01L 29/6609* (2013.01); *H01L 45/00* (2013.01); *H01L 45/141* (2013.01); *H01L 45/145* (2013.01); *H01L 45/16* (2013.01); *G11C 2013/009* (2013.01); *G11C 2213/72* (2013.01); *G11C 2213/74* (2013.01); *G11C 2213/76* (2013.01); *G11C 2216/08* (2013.01)

(56) References Cited

U.S. PATENT DOCUMENTS

| | | | | |
|---|---|---|---|---|
| 8,867,267 B2* | 10/2014 | Mouli | ................ | G11C 11/5664 |
| | | | | 257/4 |
| 9,159,375 B2* | 10/2015 | Mouli | ................ | H01L 27/1021 |
| 9,466,361 B2* | 10/2016 | Mouli | ................ | G11C 11/5664 |
| 2003/0185038 A1* | 10/2003 | Sharma | ................ | G11C 11/00 |
| | | | | 365/105 |
| 2008/0068879 A1* | 3/2008 | Ahn | ................ | G11C 11/5678 |
| | | | | 365/163 |

\* cited by examiner

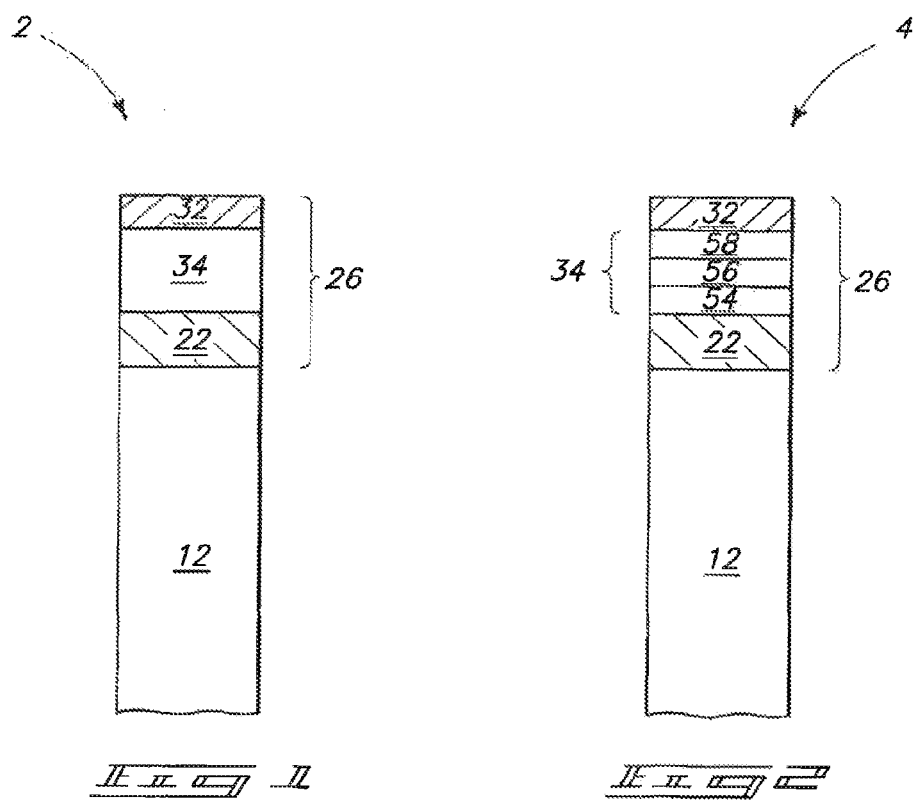
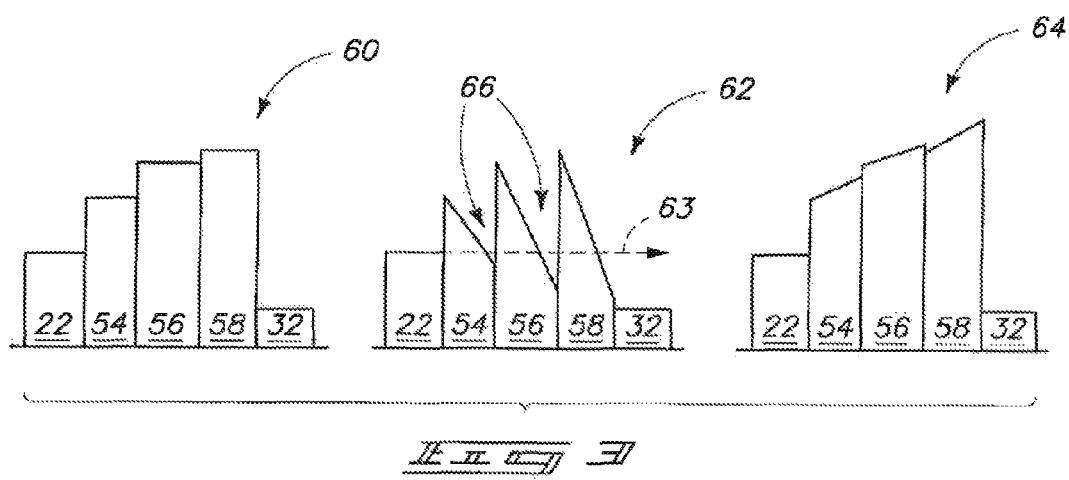

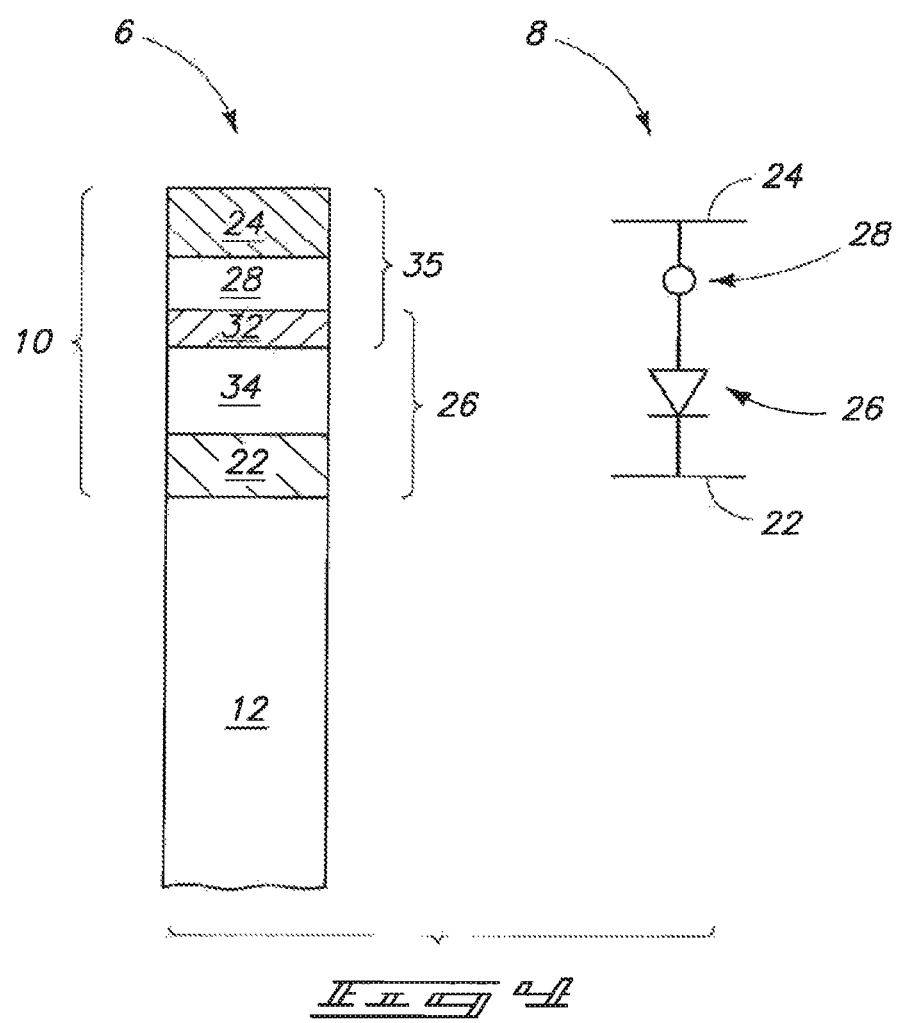

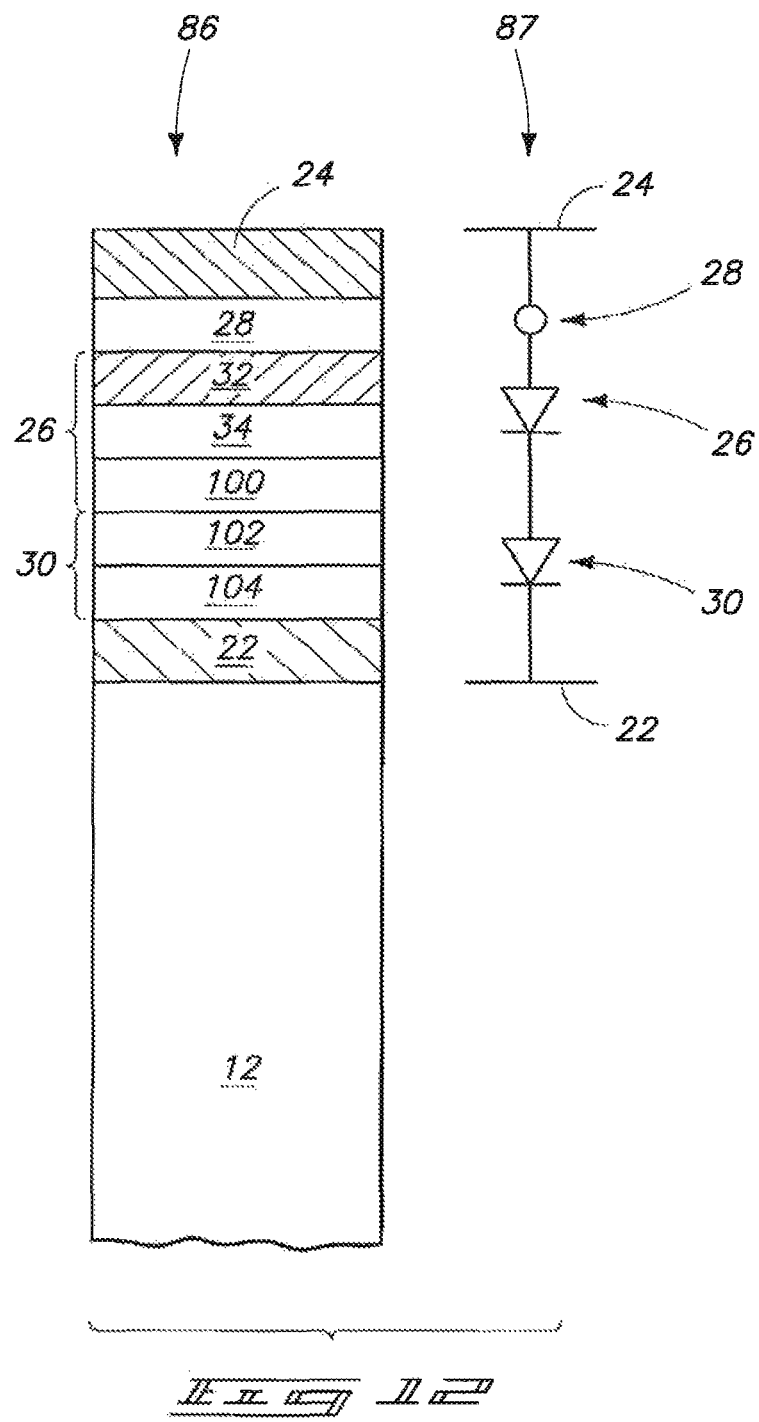

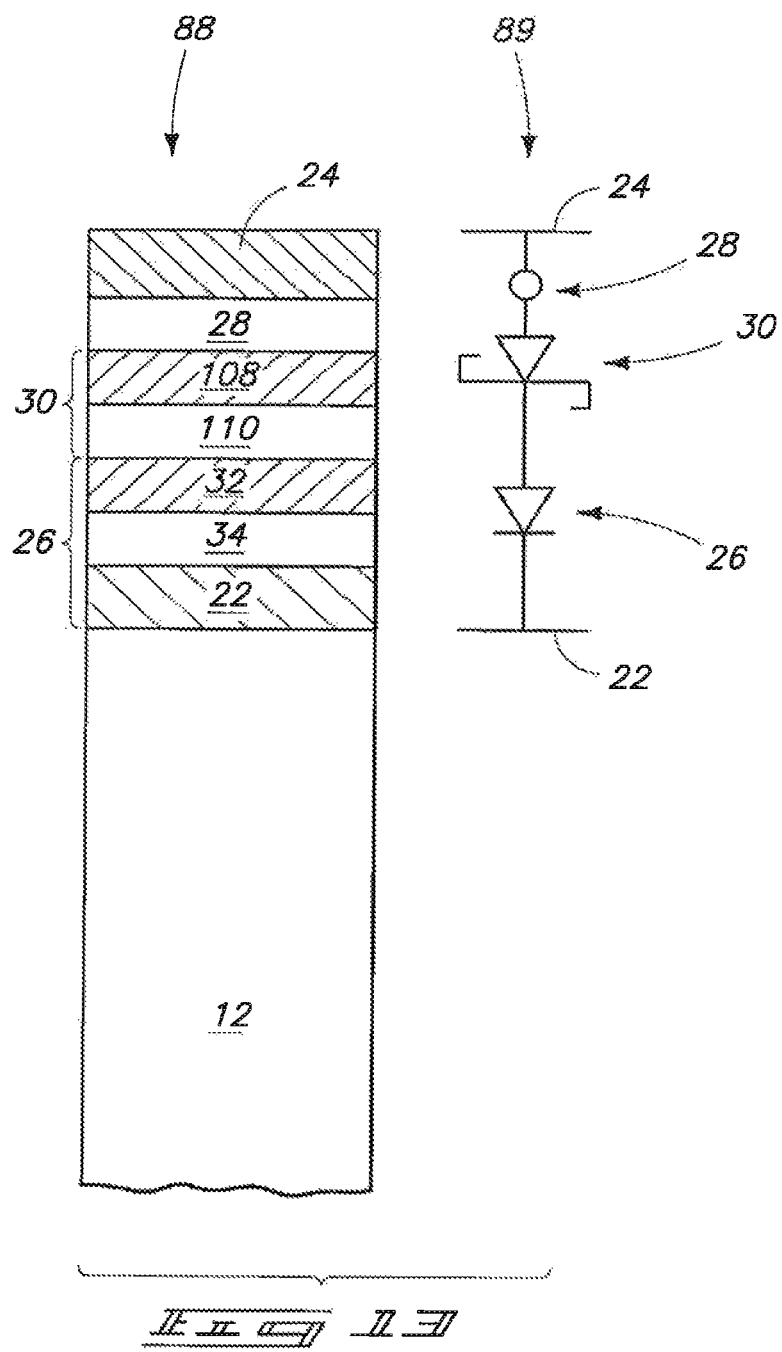

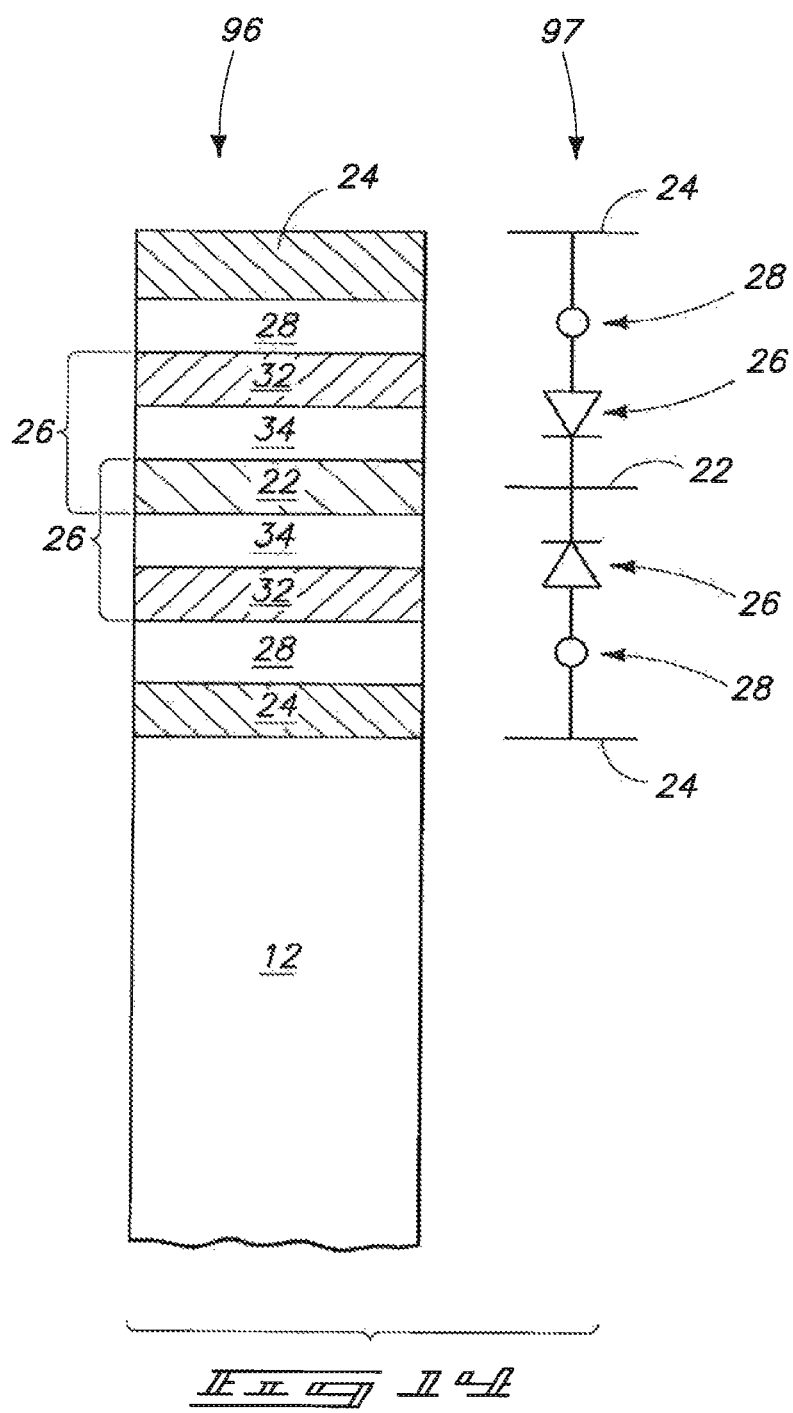

US 9,831,287 B2

MEMORY DEVICES AND MEMORY DEVICE FORMING METHODS

RELATED PATENT DATA

This application resulted from a continuation of U.S. patent application Ser. No. 14/518,810, filed Oct. 20, 2014, which resulted from a continuation of U.S. patent application Ser. No. 13/292,932, filed Nov. 9, 2011, now U.S. Pat. No. 8,867,267, which resulted from a divisional of U.S. patent application Ser. No. 12/125,797, filed May 22, 2008, now U.S. Pat. No. 8,120,951, all of which are incorporated herein by reference.

TECHNICAL FIELD

Memory devices, memory device constructions, constructions, memory device forming methods, current conducting devices, and memory cell programming methods.

BACKGROUND

A continuing goal of integrated circuit fabrication is to decrease the amount of semiconductor real estate consumed by integrated circuit devices, and to thereby increase the level of integration.

Memory may utilize a large array of memory devices. Accordingly, reduction in the size of individual memory devices may translate into a large increase in the bit density. Common memory devices are dynamic random access memory (DRAM) devices, static random access memory (SRAM) devices, and nonvolatile devices (so-called flash devices). The nonvolatile devices may be incorporated into NAND or NOR memory array architectures.

The size of a memory device may be expressed in terms of the smallest feature size utilized in fabrication of the memory device. Specifically, if the smallest feature size is designated as "F," the memory device dimensions may be expressed in units of $F^2$. Conventional DRAM memory frequently comprises dimensions of at least $6F^2$, and SRAM may require even more semiconductor real estate.

A type of memory that potentially consumes very little semiconductor real estate is so-called cross-point memory. In cross-point memory, a memory cell occurs at overlap between a wordline and a bitline. Specifically, a material which undergoes a stable and detectable change upon exposure to current is provided between the wordline and bitline. The material may be, for example, a perovskite material, a chalcogenide material, an ionic transport material, a resistive switching material, a polymeric material and/or a phase change material. Since the memory cell may be confined to a region of overlap of a bitline and wordline, the memory cell may theoretically be formed to dimensions of $4F^2$ or less.

Problems encountered in closely packing cross-point memory may include disturbance mechanisms (or so-called cross-talk) occurring when data transfer to or from one memory cell influences a neighboring memory cell.

It is desired to develop improved methods for forming highly integrated circuitry, and to develop improved highly integrated circuit constructions.

BRIEF DESCRIPTION OF THE DRAWINGS

FIG. 1 is a diagrammatic cross-sectional view of a portion of a construction in accordance with an embodiment.

FIG. 2 is a diagrammatic cross-sectional view of a portion of a construction in accordance with an embodiment.

FIG. 3 shows three band-gap diagrams illustrating three different bias conditions of a diode in accordance with an embodiment.

FIG. 4 is a diagrammatic cross-sectional view of a portion of a construction in accordance with an embodiment. FIG. 4 also shows a schematic electrical diagram of some of the components of the cross-section.

FIG. 10 also shows a schematic electrical diagram of some of the components of the cross-section.

FIG. 12 is a diagrammatic cross-sectional view of a portion of a construction in accordance with an embodiment. FIG. 12 also shows a schematic electrical diagram of some of the components of the cross-section.

FIG. 13 is a diagrammatic cross-sectional view of a portion of a construction in accordance with an embodiment. FIG. 13 also shows a schematic electrical diagram of some of the components of the cross-section.

FIG. 14 is a diagrammatic cross-sectional view of a portion of a construction in accordance with an embodiment. FIG. 14 also shows a schematic electrical diagram of some of the components of the cross-section.

DETAILED DESCRIPTION OF THE ILLUSTRATED EMBODIMENTS

Figure 5:
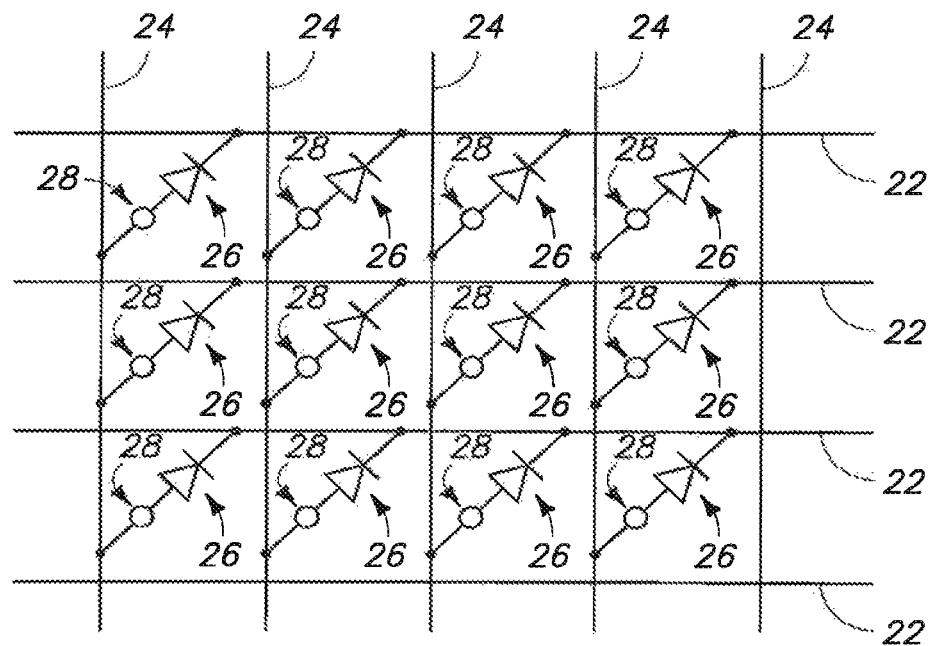
FIG. 5 is a schematic electrical diagram of an array of memory elements in accordance with an embodiment.

In some embodiments, cross-point memory cells are formed to include diodes. The diodes may be configured to enable current to pass to or from a portion of the memory cell, while also alleviating, and possibly preventing, cross-talk between adjacent devices. The diodes may contain stacked thin dielectric films, with the dielectric films being band-structure engineered to achieve tailored diode properties for particular memory cells.

It may be advantageous to utilize stacked dielectric materials for the diodes rather than utilizing conventional silicon-based n-p junction diodes. The conventional silicon-based junction diodes may be limited relative to bandgap, Shockley-Read-Hall (SRH) generation and recombination rates, active doping concentrations, injection velocity, carrier lifetime, and breakdown strength (or other high field properties such as ionization rates, etc.).

The cross-point memory cells may be arranged in vertical stacks. Stacking of the memory cells may substantially reduce the real estate consumption attributed to individual memory cells. For instance, if two 4F$^2$ memory cells are stacked such that one is directly over the other, then the amount of semiconductor real estate consumed by each is effectively cut in half so that the individual memory cells are essentially only consuming 2F$^2$ of semiconductor real estate. The reduction in effective real estate consumption increases proportionally to the number of vertically-stacked memory cells. Thus, significant strides in integration may be achieved by vertically stacking at least some of the memory cells of a memory cell array.

The stacked memory cells may be utilized as nonvolatile memory, and may correspond to single level cells (SLCs) or multilevel cells (MLCs). Such nonvolatile memory may be incorporated into NAND memory arrays. In embodiments in which multi-stacked multilevel cells (MS-MLCs) are formed, the memory may prove to be particularly low-cost, high-performance, and high-density. The stacked cells may be routed through multi-level interconnects.

In some embodiments, the fabrication of memory cells is conducted over a silicon substrate utilizing low-temperature deposition processes, and with few if any high temperature dopant activation steps. Avoidance of high-temperature processing may alleviate thermally-induced damage to integrated circuit devices. Also, many of the materials showing promise for utilization as memory elements in cross-point memory cells (for instance, Ge$_2$Se$_2$Te$_5$ and other chalcogenides, various metal oxides, etc.) lack high-temperature stability.

Example embodiments are described with reference to FIGS. 1-14.

Referring to FIG. 1, a fragment of a diode construction 2 is illustrated. The fragment comprises a base 12 and a diode 26 over base 12.

Base 12 may comprise semiconductor material, and in some embodiments may comprise, consist essentially of, or consist of monocrystalline silicon. The base may be referred to as a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

Although base 12 is shown to be homogenous, it may comprise numerous layers in some embodiments. For instance, base 12 may correspond to a semiconductor substrate containing one or more layers associated with integrated circuit fabrication. In such embodiments, such layers may correspond to one or more of metal interconnect layers, barrier layers, diffusion layers, insulator layers, etc. In some embodiments, an uppermost region of the base may comprise an electrically insulative material so that a conductive layer of diode 26 is directly against such insulative material. In some embodiments, base 12 may comprise a semiconductor-on-insulator (SOI) construction.

Diode 26 comprises conductive materials 22 and 32 and insulative material 34. In some embodiments, conductive materials 22 and 32 may be referred to as conductive diode materials (or in other words, as diode electrodes). Conductive materials 22 and 32 may comprise any suitable composition or combination of compositions, and may, for example, comprise, consist essentially of, or consist of one or more of various metals (for instance, tantalum, platinum, tungsten, aluminum, copper, gold, nickel, titanium, molybdenum, etc.), metal-containing compositions (for instance, metal nitrides, metal silicides such as tungsten silicate or tantalum silicide, etc.), and conductively-doped semiconductor materials (for instance, conductively-doped silicon). In some embodiments, conductive materials 22 and 32 may each have a thickness of from about 2 nanometers to about 20 nanometers.

In some embodiments, material 22 may include one of aluminum, tungsten, molybdenum, platinum, nickel, tantalum, copper, titanium, tungsten silicide, or tantalum silicide and material 32 may include a different one of aluminum, tungsten, molybdenum, platinum, nickel, tantalum, copper, titanium, tungsten silicide, or tantalum silicide.

Insulative material 34 may be referred to as diode dielectric material, and may comprise any suitable composition or combination of compositions. As illustrated by FIG. 1, insulative material 34 may be in direct physical contact with both material 22 and material 34.

In some embodiments, insulative material 34 comprises a stack of electrically insulative layers, with the individual layers having band gap and/or band-alignment properties tailored for the particular application of the diode. The layers may have individual thicknesses of from about 0.7 nanometers to about 5 nanometers and may comprise, consist essentially of, or consist of one or more compositions selected from the group consisting of aluminum nitride, aluminum oxide, hafnium oxide, magnesium oxide, niobium oxide, silicon nitride, silicon oxide, tantalum oxide, titanium oxide, yttrium oxide, and zirconium oxide. The oxide and nitrides are referred to in terms of the principal components, rather than in terms of specific stoichiometries. Accordingly, the oxide of silicon is referred to as silicon oxide, which encompasses the stoichiometry of silicon dioxide.

Diode 26 may be configured to conduct current from material 32 to material 22 when a first voltage is applied across material 32 and material 22 with material 32 being at a higher potential than material 22. Diode 26 may also be configured to inhibit current from flowing from material 22 to material 34 when a second voltage is applied across material 32 and material 22 with material 22 being at a higher potential than material 32. Accordingly, the second voltage may have a polarity opposite that of a polarity of the first voltage. In some embodiments, the first voltage may be between about 0.5 volts and 1.5 volts and the second voltage may be between about 0 volts and −15 volts. Accordingly, diode 26 may be characterized as a selectively conducting device whose ability to conduct current depends on an applied bias voltage.

In some embodiments, the first voltage may have the same magnitude as the second voltage. Accordingly, diode 26 may allow current to flow from material 32 to material 22 when forward biased with a voltage but may inhibit current from flowing from material 22 to material 32 when reverse biased with the same voltage.

Tunneling properties of material 34, and/or carrier injection properties of conductive materials 22 and 32, may be tailored to engineer desired properties into diode 26. For example, materials 22, 32, and 34 may be engineered so that diode 26 allows electrons to tunnel from material 22 through material 34 to material 32 when the first voltage described above is applied across material 32 and material 22 but inhibits electrons from tunneling from material 32 to material 22 when the second voltage described above is applied across material 32 and material 22.

Referring to FIG. 2, a fragment of a diode construction 4 is illustrated. Similar numbering is used in referring to FIG.

2 as is used above in describing FIG. 1 where appropriate. Fragment 4 depicts another embodiment of diode 26. Fragment 4 includes base 12 and diode 26 over base 12.

In the shown embodiment, diode dielectric material 34 comprises a stack of three different dielectric materials 54, 56, and 58. Such materials may be tailored relative to one another so that band gaps, and/or conduction band edges, and/or valence band edges, between the materials enable tunneling of carriers in one direction through the materials, but not in an opposing direction.

The dielectric materials 54, 56, and 58 may comprise any suitable materials, and may, for example, comprise one or more compositions selected from the group consisting of aluminum nitride, aluminum oxide, hafnium oxide, magnesium oxide, niobium oxide, silicon nitride, silicon oxide, tantalum oxide, titanium oxide, yttrium oxide, and zirconium oxide.

Although example diode 26 of FIG. 2 has three different dielectric materials (54, 56, and 58), in other embodiments diode 26 may comprise other than three different dielectric materials. Specifically, in some embodiments diode 26 may comprise more than three different dielectric materials, and in other embodiments, diode 26 may comprise less than three different dielectric materials. The number of different dielectric materials used in diode 26 may affect the speed with which the diode reacts to a voltage. For example, as the number of different dielectric materials increases, a difference between a time when diode 26 is biased with a voltage and a time when current begins to flow through diode 26 responsive to the voltage may decrease. However, as the number of different dielectric materials increases, a magnitude of a voltage used to forward bias diode 26 may also increase.

The embodiment of FIG. 2 may be fabricated as follows. Initially, material 22 may be formed over base 12. Material 22 may be patterned by utilizing photolithographic processing and one or more etches. Subsequently, material 54 may be formed over material 22. In some embodiments, material 54 may be deposited on material 22 and may be patterned using photolithographic processing and one or more etches. Material 54 may be deposited with any suitable methodology, including, for example, atomic layer deposition (ALD). Materials 56 and 58 may subsequently be deposited over material 54 using one or more of the techniques described above in relation to material 54.

In some embodiments, the methods used in forming materials 54, 56, and 58 may be selected so that the methods do not substantially change the dimensions of material 22 or otherwise render material 22 inoperable as an electrode of diode 26. For example, a maximum temperature used in forming materials 54, 56, and 58 may be below a melting temperature of material 22 so that material 22 does not change dimension or shape as a result of the formation of materials 54, 56, and 58. By way of another example, materials 54, 56, and 58 may be undoped. Accordingly, annealing might not be used in forming materials 54, 56, and 58. Forming these materials without annealing may be advantageous because annealing may involve undesirably altering dimensions of material 22 as a result of high temperatures used during annealing.

Subsequently, material 32 may be formed over material 58. Material 32 may be patterned by utilizing photolithographic processing and one or more etches. Material 32 may be undoped and the formation of material 32 might not use a temperature higher than a melting temperature of material 22.

FIG. 3 shows band gap diagrams of diode 26 in an unbiased condition (diagram 60), a forward biased condition (diagram 62) and a reverse biased condition (diagram 64). Diagrams 60 and 64 show that in an unbiased condition, and in a reverse biased condition, bands from dielectric materials 58, 56, and 54 preclude migration of carriers between conductive materials 22 and 32. In contrast, diagram 62 shows that tunneling may occur in a forward biased condition so that carriers (specifically electrons in the shown embodiment) may tunnel from conductive material 22 to conductive material 32 via quantum wells 66. The flow of the carriers is diagrammatically illustrated with a dashed arrow 63 in FIG. 3. It is noted that the diodes shown in FIGS. 1 and 2 are oriented for current flow from conductive material 32 to conductive material 22. Such is consistent with the diagrams of FIG. 3 which illustrate electron flow from conductive material 22 to conductive material 32 (in other words, in an opposite direction to the current flow). In other embodiments, the arrangement of material 54, 56, and 58 may be reversed so that the electron flow in the forward-biased condition is from conductive material 32 to conductive material 22.

The band structures of FIG. 3 may be considered engineered band structures. Heterostructures may be formed by molecular beam epitaxy (MBE) growth of III/V materials. In dielectric materials, a band gap may be engineered through thermal treatments (such as thermal treatment of aluminum oxides), as is known for nonvolatile memory cells (such as "crested barrier" cells and VARIOT flash cells). The band gap engineered structures may exploit characteristics of band-edge discontinuities in carrier transport in the semiconductor, and/or may exploit characteristics of band-edge discontinuities in charge storage of the dielectric. For nonvolatile memory cells, this may enable optimization of retention, and endurance characteristics.

Deposition of thin layers of dielectric material may create local quantum wells 66 which may be exploited in the diode structures described herein. The conduction band and valence band edges of the dielectrics may be engineered by material choice and/or thermal treatments. Fermi-level pinning in the metal region may be engineered by tailoring the compositions of the conductive materials at the tops and bottoms of the diodes. The barrier heights along the dielectric thickness may determine the tunneling characteristics of the structures.

The diodes described in FIGS. 1 and 2 may be considered band-gap engineered in that compositions of materials 22, 32, 54, 56, and 58 are chosen so that the forward-biased tunneling of diagram 62 occurs. In choosing materials 22 and 32, work functions may be considered. A work function may be related to an amount of energy used to remove an electron from a metal. In FIG. 3, heights of the bars corresponding to materials 22 and 32 may represent work functions of materials 22 and 32. As illustrated in FIG. 3, material 22 may have a higher work function (represented by a higher bar) than material 32. Consequently, an amount of energy used to remove an electron from material 22 may be larger than an amount of energy used to remove an electron from material 32. Designing material 22 to have a higher work function than material 32 may help enable electrons to tunnel from material 22 through materials 54, 56, and 58 to material 32.

In choosing materials 54, 56, and 58, barrier heights may be considered. A barrier height may be related to an energy difference between a conduction band of a material and a valence band of the material. In FIG. 3, heights of the bars corresponding to materials 54, 56, and 58 may represent barrier heights of materials 54, 56, and 58. In some embodiments, barrier heights of materials 54, 56, and 58 may be greater than work functions of materials 22 and 32 as is illustrated by diagram 60 of FIG. 3.

Band-gap engineering diode 26 may include selecting materials 54, 56, and 58 so that barrier heights of materials 54, 56, and 58 have a particular relationship. For example, each of materials 54, 56, and 58 may have a different barrier height. Further, as illustrated in diagram 60, materials 54, 56, and 58 may be arranged between materials 22 and 32 in order of increasing barrier height. Accordingly, material 54 (which is closest to material 22) may have the lowest barrier height of materials 54, 56, and 58, material 56 may have a barrier height larger than material 54, and material 58 may have a barrier height larger than material 56.

Materials 54, 56, and 58 may be chosen to have valence band energy levels that are aligned with respect to one another. By way of example, the valence band energy levels of materials 54, 56, and 58 may be aligned if the valence band energy levels of materials 54, 56, and 58 are substantially the same. Alternatively, materials 54, 56, and 58 may be chosen to have conduction band energy levels that are aligned with respect to one another. By way of example, the conduction band energy levels of materials 54, 56, and 58 may be aligned if the conduction band energy levels of materials 54, 56, and 58 are substantially the same.

Materials 54, 56, and 58 may be selected so that quantum wells 66 are created at the junction between material 54 and material 56 and at the junction between material 56 and 58 when diode 26 is forward biased. As was described above, diode 26 may be forward biased by a voltage applied across materials 32 and 22 so that material 32 is at a higher potential than material 22. Furthermore, in a forward biased condition, quantum wells might form between conductive materials at the tops and bottoms of the diodes (with such conductive materials being the electrodes of the diodes).

In some embodiments, during formation of diode 26, properties of materials 54, 56, and 58 may change slightly at the interfaces between materials 54, 56, and 58 due to processing steps undertaken to form diode 26. For example, small portions of materials 54 and 56 at the interface between materials 54 and 56 may mix with each other during processing, even at relatively low processing temperatures less than 550 degrees C. Mixing of portions of materials 54 and 56 may degrade the abrupt change in barrier height between materials 54 and 56 illustrated in FIG. 3, which may affect the formation of a quantum well between materials 54 and 56.

To inhibit mixing of portions of materials 54 and 56 and mixing of portions of materials 56 and 58, a first very thin layer of insulating material may be formed between materials 54 and 56. The first very thin insulating layer may be a monolayer and may prevent mixing between materials 54 and 56, thereby preserving the abrupt change in barrier height between materials 54 and 56. When diode 26 is forward biased, carriers may move freely through the first very thin insulating layer due to the carrier tunneling effect described herein. A similar second very thin insulating layer may be formed between materials 56 and 58 to prevent mixing between portions of material 56 and portions of material 58. The first and/or second very thin insulating layers may be formed, for example, by deposition using ALD. Alternatively, the first and/or second very thin insulating layers may be formed by passivation of dielectrics and/or anneals, such as in a nitrogen ambient.

The quantum wells will have discrete energy levels. The contact between one electrode and an adjacent dielectric will have a first Fermi level. When energy is provided the state may be raised to a first allowed quantum energy level, which may dramatically increase the probability of carrier tunneling. This may lead to an effective lowering of the potential barrier in the dielectric.

In a reverse bias condition (such as the condition depicted by diagram 64), the potential barrier is high and formation of any quantum well is suppressed. There is, therefore, a low probability for conduction current to flow from one metal to another—due to reduced tunneling, which approaches zero—if the dielectric thickness is appropriately tailored.

Tunneling characteristics across structures such as diode 26 indicate that there may be a sharp turn-on characteristic when the Fermi level corresponds to a lowest allowed quantum energy level. The results may be modified in the presence of phonons at higher temperatures, but a non-linear characteristic may result from such structure.

Tunneling may be a very fast process, and may occur in femto seconds. Tunneling may also be relatively independent of temperature. Accordingly, thin film diodes of the type described herein may be able to be switched very fast, and to meet high temperature reliability criteria. For example, diode 26 may be forward biased and current may flow through diode 26. Diode 26 may subsequently be reverse biased so that current is inhibited from flowing through diode 26. Diode 26 may be repeatedly forward biased and then reverse biased in this manner at a high rate. In some embodiment, the rate may exceed 10 Ghz.

Some example compositions suitable for the band-gap engineered diodes are aluminum for material 22, aluminum oxide for material 58, silicon dioxide for material 56, silicon nitride for material 54, and tungsten for material 32. Another set of exemplary compositions is molybdenum for material 22, silicon dioxide for material 58, silicon nitride for material 56, hafnium oxide for material 54 and platinum for material 32. Another set of exemplary compositions is platinum for material 22, silicon dioxide for material 58, hafnium oxide for material 56, zirconium oxide for material 54 and nickel for material 32.

Referring to FIG. 4, a fragment of a construction 6 is illustrated. Similar numbering is used in referring to FIG. 4 as is used above in describing FIGS. 1-3 where appropriate. The fragment comprises a base 12 and a memory cell 10 over the base.

A schematic electrical diagram 8 is shown adjacent fragment 6 to illustrate some of the electrical components of the fragment. The electrical diagram shows that memory cell 10 comprises a bitline 22, a wordline 24, a diode 26 and a memory element 28.

Wordline 24 and bitline 22 are shown in construction 6 to comprise electrically conductive material. Such electrically conductive material may comprise any suitable composition or combination of compositions, including one or more of various metals (for instance, tantalum, platinum, tungsten, aluminum, copper, gold, etc.), metal-containing compositions (for instance, metal nitrides, metal silicides, etc.), and conductively-doped semiconductor materials (for instance, conductively-doped silicon). The individual wordlines and bitlines may have thicknesses of from about 2 nanometers to about 20 nanometers.

Memory elements 28, conductive material 32, and wordline 24 together form memory component 35. Memory element 28 may comprise any suitable composition or combination of compositions, and may, for example, comprise, consist essentially of, or consist of one or more of perovskite materials, chalcogenide materials, ionic transport materials, resistive switching materials, polymeric materials and phase change materials.

Current within one or both of the conductive materials 32 and 24 of memory component 35 may be utilized to change a state of memory element 28 in a programming operation, or to ascertain a state of memory element 28 in a reading operation. In some embodiments, after a current has been used to change a state of memory element 28 in a programming operation and the current has ceased, memory element 28 may remain in the new state in the absence of a current or a voltage.

Conductive material 32, insulative material 34, and bitline 22 together form diode 26 as was described in detail above in relation to FIGS. 1-3. Conductive material 32 is overlapped by memory component 35 and diode 26. In some embodiments, conductive material 32 may be referred to as conductive diode material (or in other words, as a diode electrode), even though material 32 is also part of memory component 35.

In schematic electrical diagram 8, diode 26 is shown between bitline 22 and memory component 35. In other embodiments, diode 26 may be additionally or alternatively provided between wordline 24 and memory element 28.

In the shown embodiment, diode 26 permits current flow from memory component 35 to bitline 22, but restricts current flow in the opposing direction. Such can enable reading to and writing from individual memory elements, while limiting cross-talk between adjacent memory elements.

Although the diode 26 is shown oriented to direct current flow from memory component 35 to bitline 22, in other embodiments the orientation of diode 26 may be reversed. Accordingly, diode 26 may be oriented to permit current flow from bitline 22 to memory component 35, and to restrict current flow in the opposing direction.

In some embodiments, memory cell 10 may be incorporated into an array comprising both vertical stacking of memory cells and horizontal arrangement of memory cells. In some embodiments, wordline 24 may be part of a plurality of memory cells (e.g., a column of memory cells) in addition to memory cell 10 and may extend substantially orthogonally to bitline 22. Bitline 22 may be part of plurality of memory cells (e.g., a row of memory cells) in addition to memory cell 10. The term "substantially orthogonally" means that the bitlines and wordlines are more orthogonal to one another than not, which can include, but is not limited to, embodiments in which the wordlines and bitlines are entirely exactly orthogonal to one another.

FIG. 5 is a schematic circuit diagram illustrating one embodiment of an array of memory cells. FIG. 5 shows memory elements 28 and diodes 26 between wordlines 24 and bitlines 22, and further shows diodes 26 connected between memory elements 28 and bitlines 22.

The embodiment of FIG. 5 may be fabricated as follows. Initially, bitlines 22 may be formed over semiconductor base (or substrate) 12. Bitlines 22 may be patterned utilizing photolithographic processing and one or more etches to pattern bitline material into a plurality of lines.

Subsequently, a first level of diode dielectric material 34 (which may be a stack of multiple dielectric layers, e.g., as discussed above in relation to FIGS. 1-3) is formed over the bitlines. Diode dielectric material 34 may be deposited across the bitlines and spaces between the bitlines, and then patterned utilizing photolithographic processing and one or more etches to create the configuration shown in FIG. 4. In some embodiments, diode dielectric material 34 is only at cross-points of the wordlines and bitlines. In some embodiments, the diode dielectric material may be left between the bitlines rather than patterned to be only at cross-points of the wordlines and bitlines. Diode dielectric material 34 may be deposited with any suitable methodology, including, for example, ALD.

A first level of electrically conductive diode material (i.e., a diode electrode) 32 is then formed over diode dielectric material 34. Electrically conductive material 32 may be formed in the configuration shown in FIG. 4 by depositing the material and then patterning it with a photolithographically patterned mask and one or more etches.

Memory elements 28 are then formed over electrically conductive material 32. The memory elements may be formed by depositing memory element material across the bitlines and spaces between the bitlines, and then patterning the memory element material utilizing photolithographic processing and one or more etches to create the shown configuration in which the memory element material is only at cross-points of the wordlines and bitlines. In some embodiments, the memory element material may be left between the bitlines rather than patterned to be only at cross-points of the wordlines and bitlines.

A first level of wordline material is formed over the memory elements. The wordline material may be deposited across the bitlines and spaces between the bitlines, and then patterned utilizing photolithographic processing and one or more etches to create the shown configuration in which the bitlines are substantially orthogonal to the wordlines.

Subsequent levels of bitlines, diode dielectric, conductive diode material, memory elements, and wordlines may be formed using subsequent iterations of the above-discussed processing, separated by a passivation layer, to form vertically stacked memory arrays to desired heights. In some embodiments, the vertical stacks may comprise at least 3 memory cells, at least 10 memory cells, or at least 15 memory cells.

The vertically stacked memory cells may be identical to one another, or may differ from one another. For instance, the diode material utilized for memory cells at one level of a vertical stack may be different in composition from the diode material utilized for memory cells at another level of a vertical stack; or may be the same composition as the diode material utilized for the memory cells at the other level of the vertical stack.

FIG. 4 illustrates diode 26 provided between the bitline 22 and memory component 35. In other configurations, including configurations in which memory cells are stacked as discussed above, diode 26 may be provided between memory component 35 and wordline 24. The fabrication process utilized to form such other configurations may be similar to that utilized to form the configuration of FIG. 4, except that the conductive diode material and diode dielectric material may be formed after formation of the memory elements rather than before formation of the memory elements. In yet other embodiments, the orientation of the wordlines and bitlines in the memory cells may be reversed (so that the wordlines are under the bitlines) and the diodes may be formed either between the wordlines and the memory elements, or between the bitlines and the memory elements.

Returning now to FIG. 5, in order to determine a resistive state of a selected one of the memory cells of FIG. 5, a read voltage may be applied across a selected one of the wordlines 24 and a selected one of the bitlines 22. In response, a current may flow from the selected wordline 24 to the selected bitline 22. This current may be measured to determine a resistive state of the selected memory cell. For example, if the selected memory cell is configured to be programmed in either a high resistance state or a low resistance state, the current may be measured to determine whether the current corresponds to the high resistance state or the low resistance state. In some embodiments, the memory cell may be used to store a single bit of information with the low resistance state corresponding to a bit value of "0" and the high resistance state corresponding to a bit value of "1."

Each of the memory cells of FIG. 5 may be similarly read using a read voltage as described above by applying the read voltage to the wordline and bitline corresponding to the memory cell to be read. Ideally, a magnitude of the read voltage will be the same regardless of the memory cell being read. However, in some embodiments, a read voltage applied to one memory cell may have a larger or smaller magnitude than a read voltage applied to another memory cell. The difference in read voltages may result from one or more of a number of different factors. For example, the read voltage may vary slightly depending on the position of the memory cell within the array of memory cells due to the lengths of the wordlines and/or bitlines. The difference in read voltages applied to the memory cells may be described statistically by a probability density function (PDF).

Figure 6:
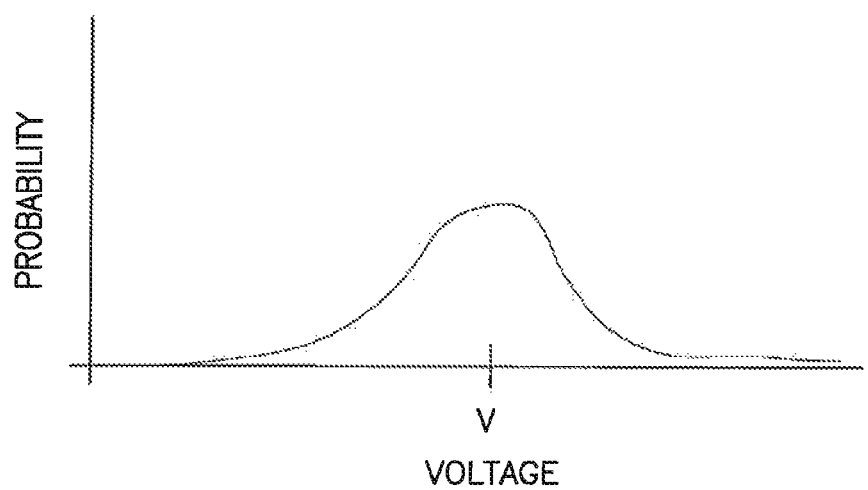
FIG. 6 is a chart depicting a voltage probability distribution function in accordance with an embodiment.

FIG. 6 illustrates such a PDF. As depicted in FIG. 6, the read voltage applied most often between a wordline and bitline may be "V." However, as indicated by the probability density function, there is a significant probability that the read voltage may be higher or lower than "V." In some embodiments, the probability density function may be a normal or Gaussian distribution.

Figure 7A:
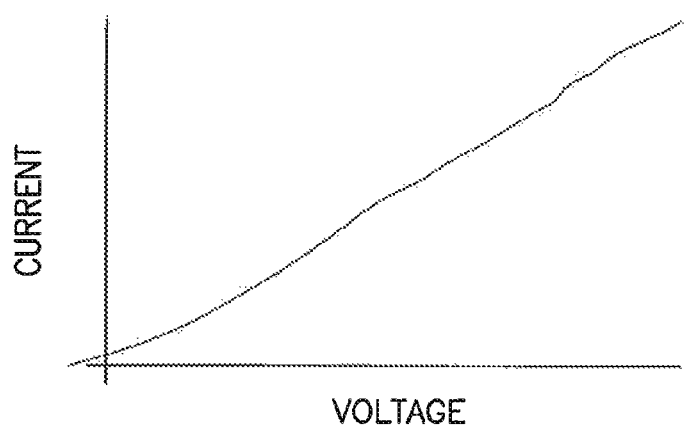
FIG. 7A is a chart depicting a voltage-current relationship in accordance with an embodiment.

FIG. 7A illustrates one embodiment of a relationship between voltages applied across a memory cell and currents conducted by the memory cell in response to the voltages. As depicted in FIG. 7A, as the voltage across the memory cell increases, the current increases. In some embodiments, the relationship between voltage and current may be substantially linear.

In some embodiments, memory element 28 may be configured in one of four different resistive states. Accordingly, memory element 28 may represent two bits of information. Of course, other embodiments are possible in which memory element 28 has more or fewer than four different resistive states and therefore represents more or fewer than two bits of information. When a voltage (e.g., a read voltage) is applied across memory cell 10, an amount of current that memory cell 10 conducts in response to the voltage may depend on the resistive state of memory element 28. Thus, the present resistive state of memory element 28 may be determined by measuring a current conducted by memory cell 10 in response to the voltage. As was discussed above, the voltage applied across memory cell 10 may vary according to a PDF such as the PDF illustrated in FIG. 6.

Figure 7B:
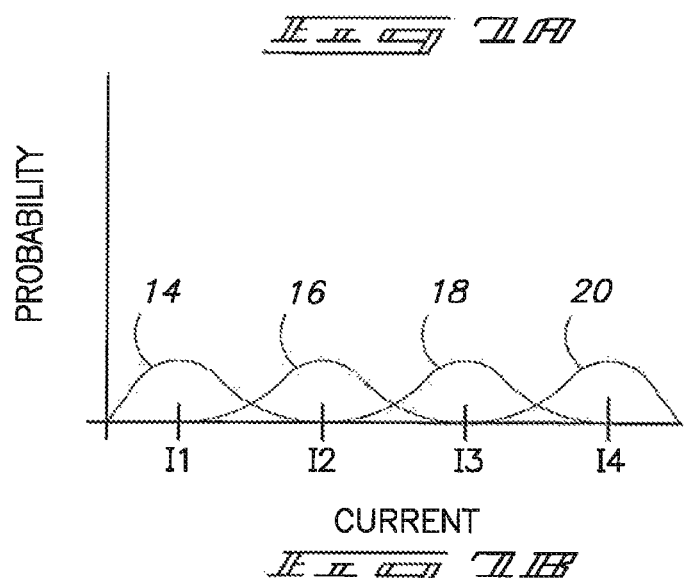
FIG. 7B is a chart depicting current probability distribution functions in accordance with an embodiment.

FIG. 7B illustrates four current probability density functions 14, 16, 18, and 20 superimposed on each other. PDF 14 may represent the probability that memory cell 10 will conduct a particular amount of current when a voltage (such as a read voltage) having the PDF illustrated in FIG. 6 is applied across memory cell 10. PDF 14 is centered at a current value of "I1." Accordingly, the most likely current value is "I1" although there is some probability that the current will be higher or lower than "I1."

PDF 14 may be associated with one of four different resistive states of memory element 28, namely the state of the four having the highest resistance and therefore the lowest current. PDFs 16, 18, and 20 are associated respectively with the other three resistive states of memory element 28. By way of example, if memory element 28 is in the second resistive state and the voltage is applied across memory cell 10, the resulting current may be centered at "I2" and may have PDF 16. Similarly, if memory element 28 is in the third resistive state, the resulting current may be centered at "I3" and have PDF 18 and if memory element 28 is in the fourth resistive state (the lease resistive state), the resulting current may be centered at "I4" and have PDF 20.

Figure 7C:
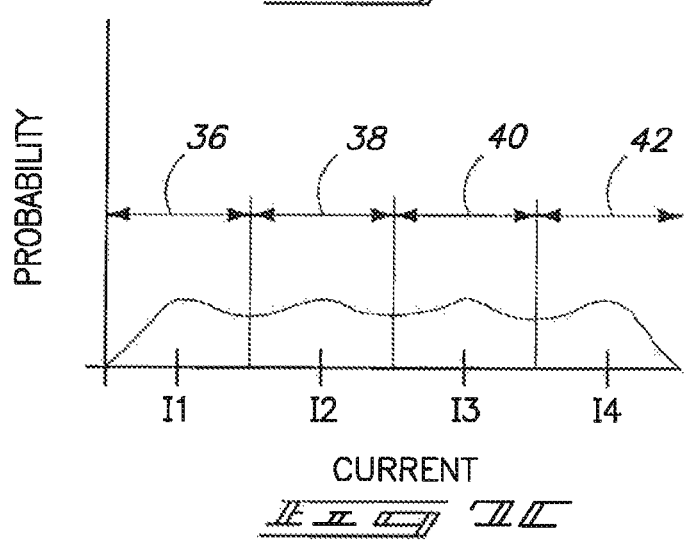
FIG. 7C is a chart depicting a current probability distribution function in accordance with an embodiment.

FIG. 7C illustrates a combination of PDFs 14, 16, 18, and 20 into a single PDF based on an assumption that memory element 28 is equally likely to be in any of the four resistive states. Note that the PDF of FIG. 7C peaks at current values "I1," "I2," "I3," and "I4." FIG. 7C also illustrates four ranges 36, 38, 40, and 42 that are associated respectively with the four resistive states of memory element 28. Ranges 36, 38, 40, and 42 may be used to determine in which state memory element 28 is configured. For example, after applying a read voltage to memory cell 10 and measuring the resulting current, if the current is within range 36 it may be determined that memory element 28 is configured in the resistive state associated with range 36 and therefore memory cell 10 is storing a particular bit value (e.g., "00") associated with the resistive state.

However, when comparing ranges 36, 38, 40, and 42 with PDFs 14, 16, 18, and 20, one may conclude that it is possible that if a current falls within range 36, memory element 28 may be configured in the second resistive state instead of the first resistive state. For example, if the read voltage applied to memory cell 10 is low (on the left hand tail of the PDF of FIG. 6) and memory element 28 is configured in the second-most resistive state (the one corresponding to PDF 16), the resulting current may fall within range 36 rather than within range 38 as might be expected. Accordingly, errors may occur when reading memory cell 10.

Figure 8A:
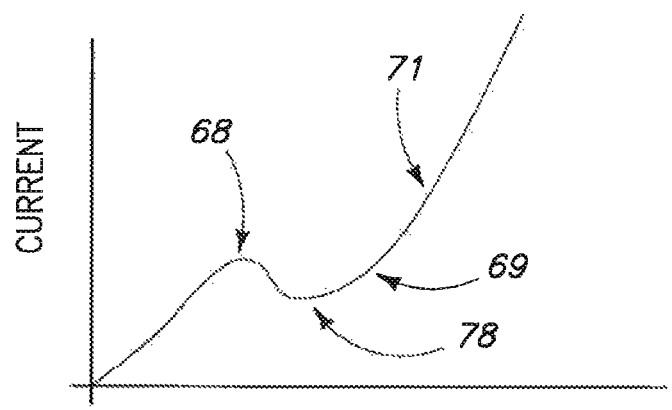
FIG. 8A is a chart depicting a voltage-current relationship in accordance with an embodiment.

FIG. 8A illustrates another embodiment of a relationship between voltages applied across a memory cell and currents conducted by the memory cell as a result of the voltages. As depicted in FIG. 8A, as the voltage across the memory cell increases from zero, the current increases to a transition point 68. As the voltage increases beyond the voltage of transition point 68, the current decreases to transition point 78. Further, as the voltage increases beyond transition point 78, the current increases.

In some embodiments, the voltage-current relationship depicted in FIG. 8A may result from diode 26. Diode 26 may be band-gap engineered (as was described above) to produce a voltage-current relationship having characteristics illustrated in FIG. 8A. Other voltage-current relationships having transition points in addition to transition points 68 and 78 are also possible.

In some embodiments, insulative material 34 of diode 26 may comprise a stack of three different dielectric materials (e.g., materials 54, 56, and 58 of FIGS. 2-3) as was described above. The plurality of layers may be band-gap engineered to have particular barrier heights. For example, layers may be arranged in order of increasing or decreasing barrier height. As a result, diode 26 may have a voltage-current relationship including two or more transition points as illustrated by FIG. 8A. In fact, if the number of layers is increased, the number of transition points may increase in some embodiments.

Thus diode 26 (e.g., an embodiment of diode 26 having a plurality of layers of dielectric materials as illustrated in FIG. 2), may conduct a first current from a first electrode (material 32) to a second electrode (material 22) when a first voltage is applied across the first and second electrodes of diode 26. For example, the first voltage and first current may correspond to the voltage and current at transition point 68 of FIG. 8A. Diode 26 may alternatively conduct a second current from the first electrode to the second electrode when a second voltage is applied across the first and second electrodes. The second voltage may have the same polarity as the first voltage and may have a larger magnitude than the first voltage. However, the second current may be smaller than the first current. For example, the second voltage and second current may correspond to the voltage and current at transition point 78 of FIG. 8A.

Diode 26 may alternatively conduct a third current from the first electrode to the second electrode when a third voltage is applied across the first and second electrodes. The third voltage may have the same polarity as the first and second voltages and may have a larger magnitude than the first and second voltages. The third current may be larger than the second current (e.g., if the third voltage and third current correspond to point 69 of FIG. 8A) and may also be larger than the first amount of current (e.g., if the third voltage and third current correspond to point 71 of FIG. 8A).

In some embodiments, a voltage-current relationship of diode 26 may include two transition points (not illustrated) in addition to transition points 68 and 78 so that diode 26 may conduct a fourth current from the first electrode to the second electrode when a fourth voltage is applied across the first and second electrodes. The fourth voltage may have the same polarity as the first, second, and third voltages and may have a larger magnitude than the first, second, and third voltages. The fourth current may be less than the third amount of current but larger than the first and second amounts of current.

Furthermore, diode 26 may have a threshold voltage above which diode 26 may conduct current and both the first voltage and the second voltage may be higher than the threshold voltage.

It should also be noted that if the first voltage and first current correspond to transition point 68 and if the voltage is increased slightly above the first voltage, the resulting current will be less than the first current. Similarly, if the voltage is decreased slightly below the first voltage, the resulting current will also be less than the first current.

Figure 8B:
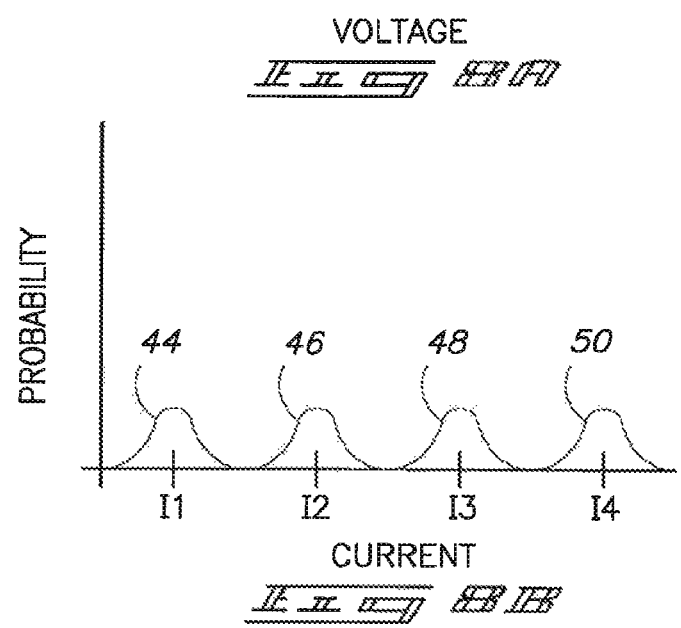
FIG. 8B is a chart depicting current probability distribution functions in accordance with an embodiment.

FIG. 8B illustrates four superimposed current probability density functions 44, 46, 48, and 50. PDFs 44, 46, 48, and 50 may be associated respectively with the four resistive states of memory element 28 described above. PDF 44 may represent the probability that memory cell 10 will conduct a particular amount of current when a voltage (such as a read voltage) having the PDF illustrated in FIG. 6 is applied across memory cell 10.

PDF 44 may be associated with one of four different resistive states of memory element 28, namely the state of the four having the highest resistance and therefore the lowest current. PDFs 46, 48, and 50 are associated respectively with the other three resistive states of memory element 28. By way of example, if memory element 28 is in the second resistive state and the voltage is applied across memory cell 10, the resulting current may be centered at "I2" and may have PDF 46. Similarly, if memory element 28 is in the third resistive state, the resulting current may be centered at "I3" and have PDF 48 and if memory element 28 is in the fourth resistive state (the lease resistive state), the resulting current may be centered at "I4" and have PDF 50.

The shapes of PDFs 44, 46, 48, and 50 are different from the shapes of PDFs 14, 16, 18, and 20 even though both sets of PDFs describe currents that result from voltages having the PDF of FIG. 6. This difference in shapes is due to the voltage-current relationship of FIG. 8A imposed by diode 26 when diode 26 is band-gap engineered to have transition points such as transition points 68 and 78. Due to this voltage-current relationship, PDFs 44, 46, 48, and 50 may have less overlap with each other than the amount of overlap between PDFs 14, 16, 18, and 20. In some embodiments, PDFs 44, 46, 48, and 50 might not have any significant overlap.

Figure 8C:
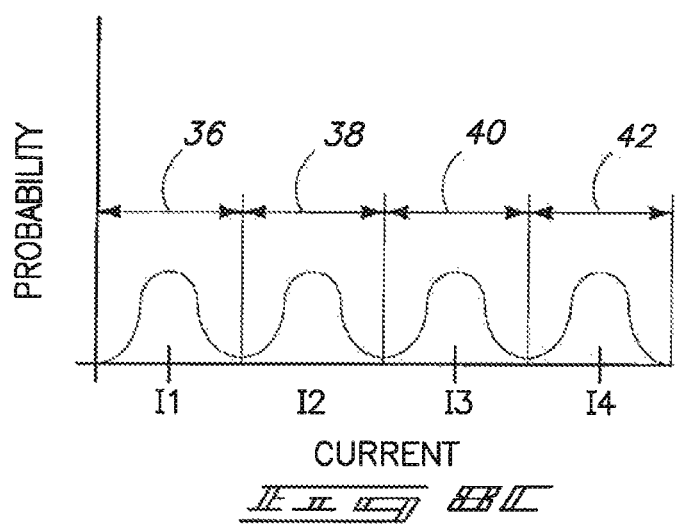
FIG. 8C is a chart depicting a current probability distribution function in accordance with an embodiment.

FIG. 8C illustrates the combination of PDFs 44, 46, 48, and 50 into a single PDF based on the assumption that memory element 28 is equally likely to be in any of the four resistive states. Note that the PDF of FIG. 8C has deep valleys between the values "I1," "I2," "I3," and "I4." Ranges 36, 38, 40, and 42 are illustrated in FIG. 8C and are associated respectively with the four resistive states of memory element 28. When comparing ranges 36, 38, 40, and 42 with PDFs 44, 46, 48, and 50, one may conclude that it is highly probably that if a current falls within range 38, memory element 28 is configured in the second resistive state, not the first resistive state since there is little or no overlap of PDF 44 or PDF 48 onto region 38. Consequently, a diode having a voltage-current relationship similar to FIG. 8A may significantly reduce errors associated with determining the resistive state of memory cell 10 as compared with a diode having a voltage-current relationship similar to FIG. 7A.

In fact, in some embodiments it might not be practical to use more than two resistive states in memory cells having a voltage-current relationship similar to FIG. 7A because of the high probability that errors may occur. Consequently, such memory cells might be configured in one of two resistive states and store only one bit of information. In contrast, if a memory cell has a voltage-current relationship similar to FIG. 8A, four memory states may be used enabling the memory cell to store two bits of information.

Figure 9:
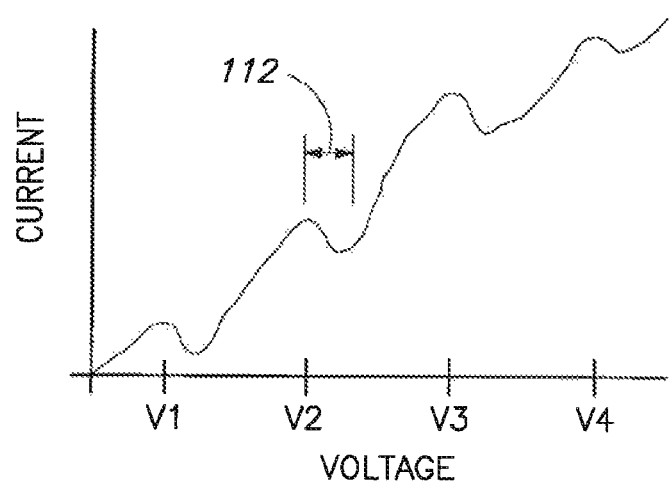
FIG. 9 is a chart depicting a voltage-current relationship in accordance with an embodiment.

FIG. 9 illustrates another voltage-current relationship of memory cell 10. According to this relationship, the current resulting from a voltage of "V1" may be a local maximum. If the voltage is increased above "V1" or decreased below "V1" the current may decrease. Similarly, voltages "V2," "V3," and "V4" may be local maximums. The voltage-current relationship of FIG. 9 may result from diode 26 if diode 26 is band-gap engineered (using methods described above) to produce such a voltage-current relationship.

In some embodiments, memory cell 10 may be configured in a first resistive state by applying a programming voltage having a value of "V1" across memory cell 10. In some embodiments, the programming voltage may have a PDF with a Gaussian distribution similar to the PDF of FIG. 6. However, a programming current conducted by memory cell 10 in response to the programming voltage may have a tighter PDF (e.g., one with a smaller width and/or standard deviation) than the PDF of the programming voltage because diode 26 may impose the voltage-current relationship of FIG. 9 onto the programming current. The programming current may alter memory element 28 so that memory element 28 is in the first resistive state.

Similarly, memory cell 10 may be configured in a second, third, or fourth resistive state by applying a programming voltage of "V2," "V3," or "V4" respectively across memory cell 10. Thus, diode 26 may narrow the range of likely programming currents as a result of the voltage-current relationship of FIG. 9. Consequently, diode 26 may enable four distinct ranges of programming currents to program memory element 28 in one of four distinct resistive states. In some embodiments, the four ranges of programming currents may be substantially non-overlapping and thus the four distinct resistive states may also be substantially non-overlapping.

By way of example, memory cell 10 may be in a first resistive state selected from among the resistive states associated with ranges 36, 40, or 42 of FIG. 8C. A first programming voltage may be applied across wordline 24 and bitline 22 so that a first current flows through memory element 28 and diode 26. The first programming voltage may be within range 112 of FIG. 9, which extends from voltage "V2" to a transition point above voltage "V2." As a result of the first current, the resistive state of memory element 28 may change from the first resistive state to a second resistive state associated with range 38 of FIG. 8C.

Subsequently, memory cell 10 may be re-programmed to be in the first resistive state instead of the second resistive state. Then, a second programming voltage may be applied across wordline 24 and bitline 22 so that a second current flows through memory element 28 and diode 26. The second programming voltage may be within range 112 and may be larger than the first programming voltage. As a result of the second current, the resistive state of armory element 28 may change from the first resistive state to the second resistive state. Despite the fact that the second programming voltage is larger than the first programming voltage, the second current may be smaller than the first current due to the voltage-current relationship of diode 26 illustrated in FIG. 9.

Other devices besides diode 26 may have a voltage-current relationship similar to the voltage-current relationship of FIG. 8A. For example, two diodes connected to form a thyristor may have a voltage-current relationship having two or more transition points similar to the voltage-current relationship of FIG. 8A.

Figure 10:
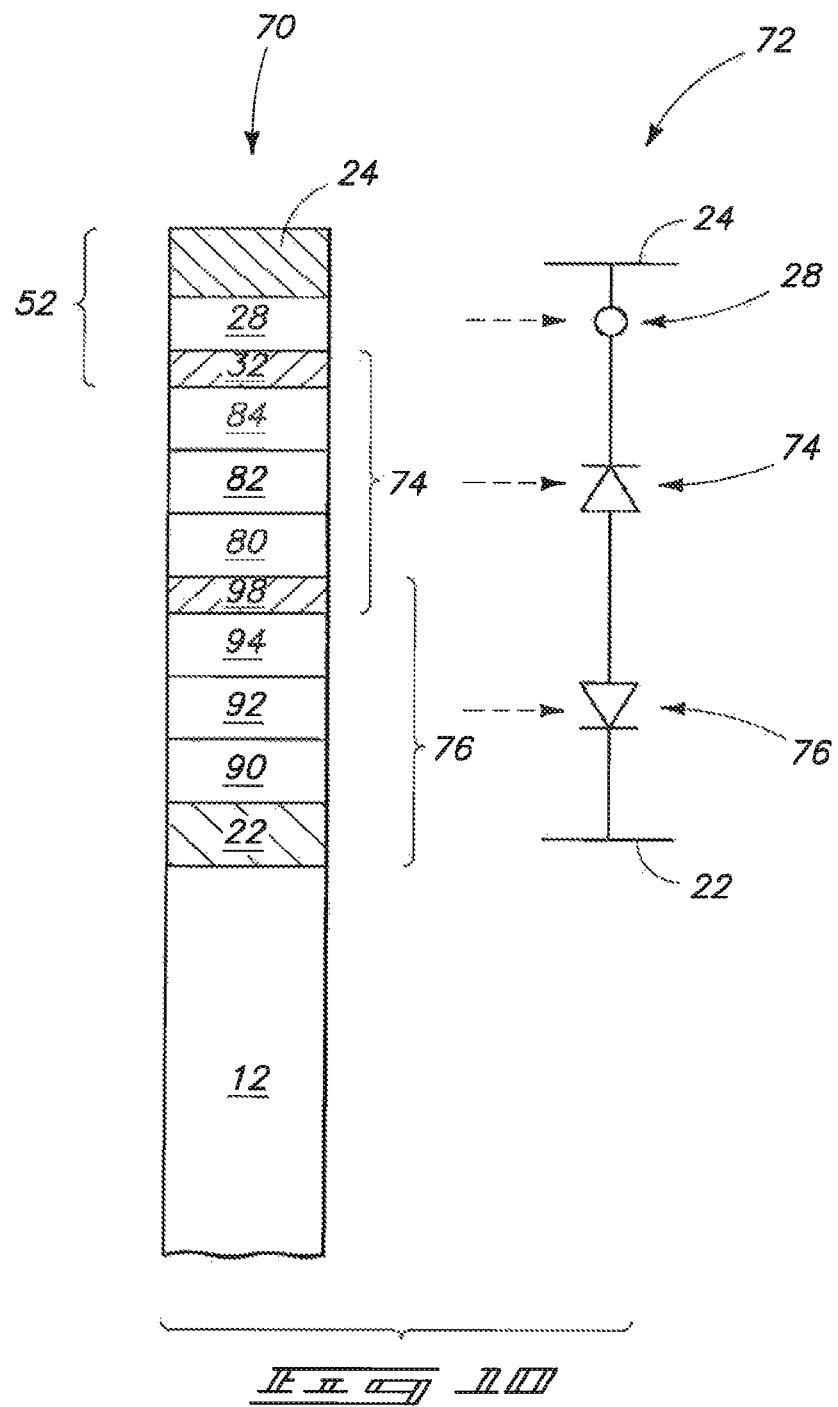
FIG. 10 is a diagrammatic cross-sectional view of a portion of a construction in accordance with an embodiment.

The memory cells of FIGS. 4-5 have a single diode in each memory cell. In other embodiments, multiple diodes may be utilized in a single memory cell. For instance, a pair of diodes may be provided in back-to-back arrangement to provide silicon controlled rectifier (SCR) or thyristor type properties. FIG. 10 illustrates a memory cell comprising a back-to-back diode arrangement. In referring to FIG. 10, similar numbering will be used as is used above in describing FIGS. 1-9, where appropriate.

FIG. 10 shows a portion 70 of a semiconductor construction, and shows a schematic electrical diagram 72 adjacent the portion 70 to illustrate electrical components comprised by the portion 70. The schematic electrical diagram 72 shows that the portion comprises wordline 22, bitline 24, memory element 28, a first diode 74, and a second diode 76. The first and second diodes are adjacent one another, and in back-to-back orientation relative to one another.

Portion 70 comprises base 12, memory component 52 (containing bitline 24, memory element 28, and conductive material 32), and the diodes 74 and 76 between the memory component and the wordline. Diode 74 comprises diode dielectric materials 80, 82, and 84 and diode 76 comprises diode dielectric materials 90, 92, and 94. Dielectric materials 80, 82, 84, 90, 92, and 94 may comprise any of the compositions discussed above for diode dielectric materials.

A conductive material 98 is between the diodes, and bridges the diodes with one another. The conductive material may comprise any suitable composition, and may, for example, comprise one or more metals (for instance, one or more of tantalum, platinum, tungsten, aluminum, copper, and gold) and/or one or more metal-containing compositions (for instance, metal silicide or metal nitride).

The combination of diodes 74 and 76 of FIG. 10 may have a voltage-current relationship having two or more transition points such as the voltage-current relationships of FIG. 8A or FIG. 9. Accordingly, when reading a memory cell including the combination of diodes 74 and 76, currents having PDFs similar in shape to those illustrated in FIG. 8B may be conducted by the memory cell. As a result, it may be practical for the memory cell to be configured in one of four different resistive states, enabling the memory cell to store two bits of information due to the fact that the PDFs are non-overlapping or minimally overlapping as was discussed above.

Figure 11:
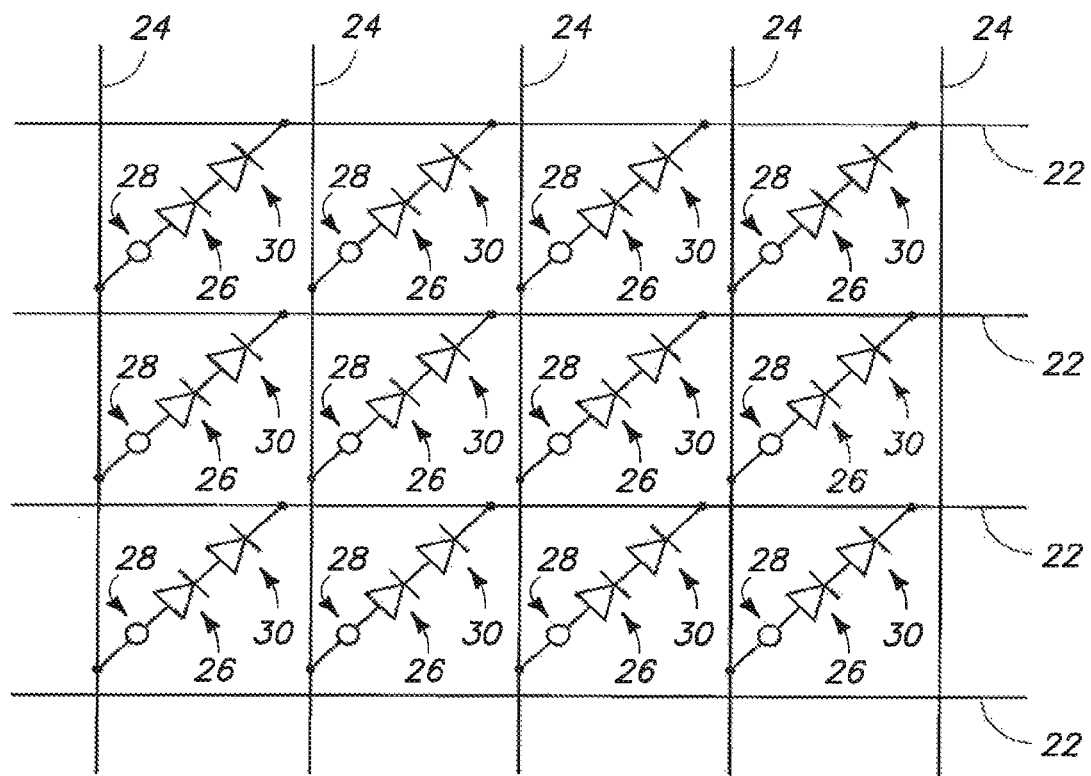
FIG. 11 is a schematic electrical diagram of an array of memory elements in accordance with an embodiment.

FIG. 11 is schematic circuit diagram illustrating one embodiment of an array of memory cells. As depicted in FIG. 11, each memory cell includes a memory element 28 and two diodes—diode 26 and diode 30.

Having two diodes in a memory cell may provide advantages over having a single diode in a memory cell. For example, diode 26 may have a voltage-current relationship similar to FIG. 8A or FIG. 9 that enables the features and benefits described above in relation to FIGS. 6-9. However, in some embodiments, diode 26 may allow a leakage current when reverse biased that may be large enough (e.g., between 0.01 uA and 0.5 uA) to consume an undesirable amount of power or disturb neighboring memory cells. In contrast, diode 30 may have a very low leakage current (e.g., a current in the picoampere or femtoampere range) when reverse biased but might have a voltage-current relationship similar to the voltage-current relationship of FIG. 7. By using diode 26 and diode 30 in series, the memory cell may have both voltage-current relationship similar to FIG. 8A or 9 and may have very low leakage current when reverse biased.

FIG. 12 shows a portion 86 of a construction and shows a schematic electrical diagram 87 adjacent portion 86 to illustrate electrical components comprised by portion 86. Similar numbering is used in referring to FIG. 12 as is used above in describing FIGS. 1-11 where appropriate.

Portion 86 comprises base 12, bitline 22, diode 26, memory element 28 and wordline 24, each of which have been discussed in detail above. In the embodiment illustrated by FIG. 12, diode 26 includes conductive material 100 instead of material 22. Material 100 may comprise any suitable composition or combination of compositions including, for example, aluminum, tungsten, molybdenum, platinum, nickel, tantalum, copper, titanium, tungsten silicide, or tantalum silicide and material 32 may include a different one of aluminum, tungsten, molybdenum, platinum, nickel, tantalum, copper, titanium, tungsten silicide, or tantalum silicide. Material 100, in some embodiments, may have a thickness of from about 2 nanometers to about 20 nanometers. As was discussed above in relation to FIGS. 1-4, material 34 may include a plurality of layers of different dielectric materials.

In addition, portion 86 includes diode 30. In some embodiments, diode 30 may include a p-doped silicon layer 102 and an n-doped silicon layer 104. In some embodiments, if diode 30 includes p-doped silicon layer 102 and n-doped silicon layer 104, material 22 may comprise a conductively-doped semiconductor (e.g., conductively-doped silicon). Diode 30 may be configured to inhibit current from flowing from bitline 22 through memory element 28 to wordline 24 when a voltage is applied across bitline 22 and wordline 24 such that bitline 22 is at a higher potential than wordline 24 (when the memory cell is reverse biased). In some embodiments, diode 30 may be configured to have a very low leakage current (e.g. less than 0.1 picoA) when reverse biased.

Another embodiment of a memory cell having two diodes is shown in FIG. 13. FIG. 13 shows a portion 88 of a construction and shows a schematic electrical diagram 89 adjacent portion 88 to illustrate electrical components comprised by portion 88. Similar numbering is used in referring to FIG. 12 as is used above in describing FIGS. 1-12 where appropriate.

Portion 88 comprises base 12, bitline 22, diode 26, memory element 28 and wordline 24, each of which have been discussed in detail above. As was discussed above in relation to FIGS. 1-4, diode 26 may include a plurality of layers of different dielectric materials.

In addition, portion 88 includes diode 30. In the depicted embodiment, diode diode 30 includes a semiconductor material 110 and a metal material 108 in direct physical contact with semiconductor material 110 that together form a Schottky diode. Metal material 108 may comprise any suitable composition or combination of compositions including, for example, tungsten, tantalum, titanium, molybdenum, copper, cobalt, platinum, palladium, nickel, and their silicides. Metal material 108 may additionally or alternatively include one or more of zirconium, manganese, zinc, indium, scandium, yttrium, and their oxides. Semiconductor material 110 may comprise amorphous silicon and/or crystalline silicon. In some embodiments, semiconductor material 110 may be undoped.

Schottky diode 30 may be configured to inhibit current from flowing from bitline 22 through memory element 28 to wordline 24 when a voltage is applied across bitline 22 and wordline 24 such that bitline 22 is at a higher potential than wordline 24 (when the memory cell is reverse biased). In some embodiments, diode 30 may be configured to have a very low leakage current (e.g. less than 0.1 picoA) when reverse biased.

The embodiment of FIG. 13 may be fabricated as follows. Initially, material 22 may be formed over base 12. Material 22 may be patterned by utilizing photolithographic processing and one or more etches. Subsequently, material 34 may be formed over material 22. In some embodiments, material 34 may be deposited on material 22 and may be patterned using photolithographic processing and one or more etches. Material 34 may be deposited with any suitable methodology, including, for example, atomic layer deposition (ALD). As was discussed above, material 34 may include a plurality of layers of different dielectric materials. In this case, the layers of material 34 may be individually deposited and patterned using photolithographic processing and one or more etches.

In some embodiments, the methods used in forming material 34 may be selected so that the methods do not substantially change the dimensions of material 22 or otherwise render material 22 inoperable as an electrode of diode 26. For example, a maximum temperature used in forming material 34 may be below a melting temperature of material 22 so that material 22 does not change dimension or shape as a result of the formation of materials 34.

Subsequently, material 32 may be formed over material 34. Material 32 may be patterned by utilizing photolithographic processing and one or more etches. Material 32 may be undoped and the formation of material 32 might not use a temperature higher than a melting temperature of material 22. Next, semiconductor material 110 may be formed over material 32. For example, semiconductor material 110 may be deposited. Semiconductor material 110 may be patterned by utilizing photolithographic processing and one or more etches. As was mentioned above, semiconductor material 110 may be undoped since doping and/or annealing semiconductor material 110 might involve temperatures higher than a melting temperature of material 22 or material 34.

Next, metal material 108 may be formed over semiconductor material 110. Metal material 108 may be deposited, for example, using ALD. Metal material 108 may be patterned by utilizing photolithographic processing and one or more etches.

Memory element 28 is then formed over metal material 108. Memory element 28 may be formed by patterning the memory element material utilizing photolithographic processing and one or more etches.

Wordline material is then formed over memory element 28. A maximum temperature used in forming wordline 24 and memory element 28 may be below a melting temperature of materials 108, 32, and 22 so that these materials do not change dimension or shape as a result of the formation of wordline 24 or memory element 28.

FIG. 13 illustrates diode 26 provided between the bitline 22 and diode 30. In other configurations, diode 26 may be provided between memory element 28 and diode 30. The fabrication process utilized to form such other configurations may be similar to that utilized to form the configuration of FIG. 13, except that diode 26 may be formed after diode 30 rather than before diode 30. In yet other embodiments, the orientation of the wordline and bitline may be reversed (so that the wordline is under the bitline) and the diodes may be formed either between the wordline and the memory elements, or between the bitline and the memory elements.

In some embodiments, two memory cells stacked vertically may share a single bitline. Fabricating such vertically stacked memory cells may use fewer processing steps than if the two vertically stacked memory cells each had a different bitline.

FIG. 14 shows a portion 96 of a construction and shows a schematic electrical diagram 97 adjacent portion 96 to illustrate electrical components comprised by portion 96. Similar numbering is used in referring to FIG. 14 as is used above in describing FIGS. 1-13 where appropriate.

Portion 96 comprises base 12, two wordlines 24, two memory elements 28, two diodes 26, and a bitline 22, each of which have been discussed in detail above. As was discussed above in relation to FIGS. 1-4, each of diodes 26 may include a plurality of layers of different dielectric materials.

The upper memory cell of portion 96 may be read or programmed by applying a voltage across the upper wordline 24 and the bitline 22 so that the upper wordline 24 is at a higher potential than bitline 22 and the upper diode 26 is forward biased. In response to the voltage, a current may flow from the upper wordline 24 through the upper memory cell to bitline 22. The current may be used to read the upper memory cell or to program the upper memory cell. While reading or programming the upper memory cell, a voltage may be applied across the lower memory cell that reverse biases the lower diode 26 so that the current flowing through the upper memory cell is inhibited from flowing from bitline 22 through the lower memory element 28 to the lower wordline 24 thereby reducing the possibility that a resistive state of the lower memory cell will be altered while reading or programming the upper memory cell. To reverse bias lower diode 26, a voltage may be applied across bitline and the lower wordline 24 so that bitline 22 is at a higher potential than lower wordline 24.

A similar process may be used when reading or programming the lower memory cell of portion 96 whereby the upper diode 26 is reverse biased while the lower diode 26 is forward biased allowing a current to flow through the lower memory cell. The current may be used to read or program the lower memory cell. Since the upper diode 26 is reverse biased, the upper diode may inhibit the current from flowing through the upper memory element 28 thereby reducing the possibility that a resistive state of the upper memory cell will be altered while reading or programming the lower memory cell.

The embodiment of FIG. 14 may be fabricated as follows. Initially, material 24 may be formed over base 12. Material 24 may be patterned by utilizing photolithographic processing and one or more etches. In some embodiments, material 24 may be deposited on base 12 using any suitable methodology, including, for example, atomic layer deposition (ALD).

Memory element 28 is then formed over metal material 24. Memory element 28 may be formed by patterning the memory element material utilizing photolithographic processing and one or more etches. Subsequently, material 32 may be formed over material 34. Material 32 may be patterned by utilizing photolithographic processing and one or more etches. Material 34 may then be formed over material 32. As was discussed above, material 34 may include a plurality of layers of different dielectric materials. In this case, the layers of material 34 may be individually deposited and patterned using photolithographic processing and one or more etches.

In some embodiments, the methods used in forming material 34 may be selected so that the methods do not substantially change the dimensions of material 24 or otherwise render material 24 inoperable. For example, a maximum temperature used in forming material 34 may be below a melting temperature of material 24 so that material 24 does not change dimension or shape as a result of the formation of material 34. Forming material 34 without annealing may be advantageous because annealing may involve undesirably altering dimensions of material 24 due to high temperature.

Material 22 may subsequently be formed over material 34. Material 22 may be patterned by utilizing photolithographic processing and one or more etches. In some embodiments, material 22 may be deposited on material 34 using any suitable methodology, including, for example, atomic layer deposition (ALD). The methods of forming materials 34, 32, 28, and 24 are then repeated to form the upper memory cell.

FIG. 14 illustrates diode 26 provided between the bitline 22 and memory element 28. In other configurations, diode 26 may be provided between memory element 28 and wordline 24. The fabrication process utilized to form such other configurations may be similar to that utilized to form the configuration of FIG. 14. Furthermore, in some embodiments, one or both of the memory cells of portion 96 may include two diodes (e.g., diode 26 and diode 30) rather than a single diode as was described above in relation to FIG. 13.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory device comprising:
   a wordline;
   a bitline;
   a memory element between the wordline and the bitline; and
   a diode between the wordline and the bitline, the diode comprising a at least three dielectric layers and conductive diode material, the at least three dielectric layers between the bitline and the conductive diode material.

2. The memory device of claim 1 further comprising more than three dielectric layers.

3. The memory device of claim 1 wherein at least two of the at least three dielectric layers are different dielectric materials.

4. The memory device of claim 1 wherein the at least three dielectric layers are different dielectric materials.

5. The memory device of claim 1 wherein the bitline comprises a metal and wherein one dielectric layer of the at least three dielectric layers most proximate the bitline comprises a metal oxide, the metal of the metal oxide being different from the metal of the bitline.

6. The memory device of claim 1 wherein the at least three dielectric layers comprise one or more of the following compositions: aluminum nitride, aluminum oxide, hafnium oxide, magnesium oxide, niobium oxide, silicon nitride, silicon oxide, tantalum oxide, titanium oxide, yttrium oxide, and zirconium oxide.

7. The memory device of claim 1 further comprising a very thin layer of insulating material between at least two of the at least three dielectric layers.

8. The memory device of claim 7 wherein the very thin layer of insulating material comprises a monolayer.

9. The memory device of claim 1 wherein the bitline comprises a first diode electrode of the diode and the conductive diode material comprises a second diode electrode of the diode.

10. The memory device of claim 1 wherein the at least three dielectric layers comprise undoped dielectric material.

11. The memory device of claim 1 wherein the bitline comprises a metal and wherein one dielectric layer of the at least three dielectric layers most proximate the bitline comprises silicon material.

12. A memory device forming method comprising:
    forming a first diode electrode;
    providing a first diode dielectric layer over the first diode electrode;
    providing a second diode dielectric layer over the first diode dielectric layer;
    providing a third diode dielectric layer over the second diode dielectric layer;
    forming a second diode electrode over the third diode dielectric layer; and
    forming a memory element over the second diode electrode.

13. The memory device of claim 12 wherein the first diode electrode comprises a bitline.

14. The memory device of claim 12 wherein the providing of at least one of the first, second and third diode dielectric layers comprises utilizing an atomic layer deposition method.

15. The memory device of claim 12 further comprising forming a wordline over the memory element.

16. The memory device of claim 12 wherein the providing of the first, second and third diode dielectric layers comprises utilizing maximum temperatures that are below the melting point of the first diode electrode.

17. The memory device of claim 12 further comprising providing a monolayer of insulative material between two of the diode dielectric layers.

18. The memory device of claim 12 wherein the first, second and third diode dielectric layers each comprise undoped dielectric material.

19. The memory device of claim 12 wherein the first diode electrode comprises a metal and wherein the first diode dielectric layer comprises silicon material.

20. The memory device of claim 12 wherein the first diode electrode comprises a metal and wherein the first diode dielectric layer comprises a metal oxide, the metal of the metal oxide being different from the metal of the first diode electrode.

\* \* \* \* \*